US008222510B2

(12) United States Patent
Majumdar et al.

(10) Patent No.: US 8,222,510 B2
(45) Date of Patent: Jul. 17, 2012

(54) COMPLEX OXIDES USEFUL FOR THERMOELECTRIC ENERGY CONVERSION

(75) Inventors: Arunava Majumdar, Orinda, CA (US); Ramamoorthy Ramesh, Moraga, CA (US); Choongho Yu, College Station, TX (US); Matthew L. Scullin, Berkeley, CA (US); Mark Huijben, Enschede (NL)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/539,135

(22) Filed: Aug. 11, 2009

(65) Prior Publication Data
US 2010/0051079 A1    Mar. 4, 2010

Related U.S. Application Data

(63) Continuation of application No. PCT/US2008/055720, filed on Mar. 3, 2008.

(60) Provisional application No. 60/892,820, filed on Mar. 2, 2007.

(51) Int. Cl.
*H01L 35/34* (2006.01)
*H01L 35/14* (2006.01)
*H01L 35/30* (2006.01)
*H01B 1/08* (2006.01)

(52) U.S. Cl. .... 136/201; 136/239; 136/205; 252/519.12

(58) Field of Classification Search ........................ None
See application file for complete search history.

(56) References Cited

U.S. PATENT DOCUMENTS

| | | | |
|---|---|---|---|
| 4,401,694 A * | 8/1983 | Quick et al. ..................... 438/96 |
| 5,124,310 A * | 6/1992 | Ovshinsky et al. ........... 505/461 |
| 6,727,424 B2 | 4/2004 | Funahashi et al. |
| 7,291,781 B2 | 11/2007 | Funahashi et al. |
| 2002/0037813 A1 | 3/2002 | Funahashi et al. |
| 2003/0168641 A1 | 9/2003 | Funahashi et al. |
| 2004/0018409 A1 * | 1/2004 | Hui et al. ........................ 429/33 |
| 2004/0232893 A1 | 11/2004 | Ogadawa et al. |
| 2005/0255315 A1 * | 11/2005 | Yamanaka et al. ............ 428/357 |
| 2006/0021646 A1 * | 2/2006 | Yotsuhashi et al. ......... 136/236.1 |
| 2006/0037638 A1 | 2/2006 | Funahashi et al. |
| 2006/0102224 A1 | 5/2006 | Chen et al. |
| 2006/0255310 A1 | 11/2006 | Funahashi et al. |

FOREIGN PATENT DOCUMENTS
EP    494580 A1 *   7/1992

OTHER PUBLICATIONS

Ohta et al. "Large thermoelectric performance of heavily Nb-doped SrTiO3 epitaxial film at high temperature." Applied Physics Letters 87, 092108 (2005).*
Khan et al. "Thermoelectric properties of niobium doped hexagonal barium titanate." Materials Letters 47 (2001) 95-101.*

(Continued)

*Primary Examiner* — Jennifer K. Michener
*Assistant Examiner* — Magali P Slawski
(74) *Attorney, Agent, or Firm* — Robin C. Chiang; Lawrence Berkeley National Laboratory

(57) ABSTRACT

The invention provides for a thermoelectric system comprising a substrate comprising a first complex oxide, wherein the substrate is optionally embedded with a second complex oxide. The thermoelectric system can be used for thermoelectric power generation or thermoelectric cooling.

26 Claims, 5 Drawing Sheets

OTHER PUBLICATIONS

PCT/US08/55720 International Search Report dated Jun. 30, 2008.
PCT/US08/55720 Written Opinion dated Jun. 30, 2008.
Borca-Tascuic, T. et al., "Data reduction in 3v method for thin-film thermal conductivity determination," Rev. Sci. Instrum., vol. 72, No. 4, Apr. 2001, pp. 2139-2147.
Cahill, David G., "Analysis of heat flow in layered structures for time-domain thermoreflectance," Rev. Sci. Instrum., vol. 75, No. 12, Dec. 2004, pp. 5119-5122.
Cahill, David G., "Thermal conductivity measurement from 30 to 750K: the 3w method," Rev. Sci. Instrum., vol. 61, No. 2, Feb. 1990, pp. 802-808.
Chen, G., "Size and Interface Effects on Thermal Conductivity of Superlattices and Periodic Thin-Film Structures," J. Heat Transfer, vol. 119, Issue 2, May 1997 [Abstract Only].
Frederikse, H.P.R. and Hosler, W.R., "Hall Mobility in SrTiO3," Phys. Rev., vol. 121, No. 3, Sep. 1967, pp. 822-827.
Frederikse, H.P.R., Thurber, W.R., and Hosler, W.R., "Electronic Transport in Strontium Titanate," Phys. Rev., vol. 134, No. 2A, Apr. 1964, pp. A442-A445.
Harman, T.C. et al., "Quantum Dot Superlattice Thermoelectric Materials and Devices," Science, vol. 297, Sep. 2002, pp. 2229-2232.
Hillhouse, H.W. and Tuominen, M.T., "Modeling the thermoelectric transport properties of nanowires embedded in oriented microporous and mesoporous films," Microporous and Mesoporous Materials, vol. 47 (2001) 39-50.
Hsu, Kuei Fang, et al., "Cubic AgPbmSbTe2+m: Bulk Thermoelectric Materials with High Figure of Merit," Science vol. 303 (2004), pp. 818-821.
Kan, D. et al, "Blue-light emission at room temperature from Ar+-irratiated SrTiO3," Nature Materials, vol. 4, Nov. 2005, pp. 816-819.
Kim, W. et al, "Thermal Conductivity Reduction and Thermoelectric Figure of Merit Increase by Embedding Nanoparticles in Crystalline Semiconductors," Physical Review Letters, vol. 96, Feb. 2006, 045901.
Koga, T. et al, "Experimental proof-of-principle investigation of enhanced Z3DT in (001) oriented Si/Ge superlattices," Applied Physics Letters, vol. 77, No. 10, Sep. 2000, pp. 1490-1492.
Muller, D.A. et al., "Atomic-scale imaging of nanoengineered oxygen vacancy profiles in SrTiO3," Nature, vol. 430, Aug. 2004, pp. 657-661.
Muta, H. et al., "Thermoelectric properties of reduced and La-doped single-crystalline SrTiO3," J. Alloys and Compounds, vol. 392 (2005), pp. 306-309.
Obara, H. et al., "Thermoelectric Properties of Y-Doped Polycrystalline SrTiO3," Japanese Journal of Applied Physics, vol. 43, No. 4B, (2004) pp. L540-L542.
Ohta, S. et al., "Large thermoelectric performance of heavily Nb-doped SrTiO3 epitaxial film at high temperature," Applied Physics Letters, vol. 87, 092108 (2005).
Ohta, S. et al., "High-temperature carrier transport and thermoelectric properties of heavily La- or Nb-doped SrTiO3 single crystals," J. Applied Physics, vol. 97, 034106 (2005).
Ohta, H. et al., "Giant thermoelectric Seebeck coefficient of a two-dimensional electron gas in SrTiO3," Nature Materials, vol. 6, Feb. 2007, pp. 129-134.
Ohtomo, A. et al. "Artificial charge-modulation in atomic-scale perovskite titanate superlattices," Nature, vol. 419, Sep. 2002, pp. 378-380.
Okuda, T. et al, "Large thermoelectric response of metallic perovskites: Sr1-xLaxTiO3 (0≤x≤0.1)," Physical Review B, vol. 63, Mar. 2001, 113104.
Schnelle, W. et al., "Specific heat capacity and thermal conductivity of NdGaO3 and LaAlO3 single crystals at low temperatures," J. Phys. D: Appl. Phys. 34 (2001) 846-851.
Szot, K. et al., "Localized Metallic Conductivity and Self-Healing during Thermal Reduction of SrTiO3," Physical Review Letters, vol. 88, No. 7, Feb. 2002, 075508.
Terasaki, I. et al, "Large thermoelectric power in NaCo2O4 single crystals," Physical Review B, vol. 56, No. 20, Nov. 1997, 12685.
Venkatasubramanian, R. et al., Thin-film thermoelectric devices with high room-temperature figures of merit, Nature, vol. 413, Oct. 2001, pp. 597-602.
Wunderlich, W. et al., "Enhanced effective mass in doped SrTiO3 and related perovskites," ArXiv/condmat0510013 v04, pp. 1-10.
Yu, Z. et al., "Epitaxial perovskite thin films grown on silicon by molecular beam epitaxy," J. Vac. Sci. Technol. B, vol. 18, No. 3, May/Jun. 2000, pp. 1653-1657.

\* cited by examiner

COMPLEX OXIDES USEFUL FOR THERMOELECTRIC ENERGY CONVERSION

CROSS-REFERENCE TO RELATED APPLICATIONS

This application claims priority as continuation application to PCT International Patent Application Ser. No. PCT/US2008/055720, filed on Mar. 3, 2008, which claims priority to U.S. Provisional Patent Application Ser. No. 60/892,820, filed on Mar. 2, 2007, respectively; which are hereby incorporated by reference.

STATEMENT OF GOVERNMENTAL SUPPORT

The invention described and claimed herein was made in part utilizing funds supplied by the U.S. Department of Energy under Contract No. DE-AC02-05CH11231. The government has certain rights in this invention.

FIELD OF THE INVENTION

This invention relates generally to complex oxides useful for thermoelectric energy conversion.

BACKGROUND OF THE INVENTION

Solid-state thermoelectric systems that can convert thermal energy to electrical energy directly are very attractive because they can be operated with various types of heat energy sources and they are environmentally benign. Furthermore, the systems can be operated in refrigeration, heat pump, or power generation mode, and they can be made either very large or miniaturized because of leg-type structures that are simpler than those of conventional systems that require hazardous working fluid or complicated moving parts. Consequently, thermoelectric systems are extremely promising for a variety of applications including, for example, cooling systems for the local heating in microprocessors and optical components, and power generation systems that recover waste heat from conventional power plants and in hybrid automobiles.

However, the conversion efficiencies for current thermoelectric materials based on bismuth telluride and/or semiconductors are not high enough to make them economically viable as compared to current energy conversion systems. In addition, popular thermoelectric materials tellurium and bismuth are toxic and hazardous. Thus, it has been impossible for current thermoelectric systems to become widely used.

With worldwide energy and climate crises on hand, research into high-Z thermoelectric materials has re-emerged with utmost importance. As energy prices rise and thermoelectric efficiency improves, the prospect of thermoelectric energy conversion devices becoming widespread is now on the horizon. In addition, heat transport from microprocessors is becoming more often the limiting factor in improving performance. Thermoelectric Peltier devices could play a significant role in upholding Moore's law in the near future.

Many recent studies on the improved properties of nanoscale thermoelectric materials have offered new options in engineering the thermoelectric properties S, $\sigma$, and $\kappa$, though few if any offer any fundamental understanding that may lead to bulk devices with ZT>5. While the present state-of-the-art, Bismuth Telluride, is well understood, materials such as strontium titanate with much higher known thermopowers offer both a non-toxic platform from which to engineer a higher ZT and a pathway to understanding thermoelectricity in more complex material systems.

As far back as 1967, a study on the transport properties of bulk strontium titanate (STO) and several of its doped forms revealed that oxygen-deficient strontium titanium oxide (STO) achieved a thermopower S as high as 800 mV/K. Other work has revealed that Lanthanum-doped STO (SLTO), such as having the formulae $Sr_{1-x}La_xTiO_3$, has a lower thermopower (~300 mV/K at low La concentration, decreasing with added La) but much higher electrical conductivity $\sigma$ and so can achieve higher ZT (~0.1 at 300K). In addition, a recent study by H. Ohta et al. has brought yet new attention to the thermoelectric properties of STO, in which is attributed a "giant" thermopower to a 2DEG at a rutile-$TiO_2$/STO interface, though the overall ZT of this device is low due to the low conductance of the interfacial layer compared with that of the surrounding substrate and thin-film.

U.S. Pat. Nos. 6,727,424 and 7,291,781 and U.S. patent Application Pub. Nos. 2006/0037638, 2003/0168641, and 2002/0037813 disclose certain complex oxides having certain thermoelectric properties.

SUMMARY OF THE INVENTION

The invention provides for a thermoelectric system, comprising a substrate comprising a first complex oxide. The substrate can further comprise a second complex oxide (a) embedded within the first complex oxide or (b) is a first layer directly or indirectly over one surface of the first complex oxide. The second complex oxide can be any suitable nanostructure embedded within the first complex oxide.

A suitable first complex oxide for use in the present invention is of the formula $M^1_{a-x}M^2_bM^3_xO_{c-\delta}$ or $M^1_aM^2_{b-x}M^3_xO_{c-\delta}$; wherein $M^1$ is one element selected from the group consisting of Na, K, Li, Ti, V, Cr, Mn, Fe, Ni, Cu, Zn, Pb, Ca, Sr, Ba, Al, Y, and Bi; wherein $M^2$ is one element selected from the group consisting of Ti, V, Cr, Mn, Fe, Co, Ni, Cu, Mo, W, Nb, Ta, and Ag; $M^3$ is one element selected from the group consisting of La, Nb, and Y; $M^1$, $M^2$ or $M^3$ are different elements; and $1 \leq a \leq 4$; $1 \leq b \leq 4$; $2 \leq c \leq 10$; $0 \leq x \leq 4$; and $0 < \delta \leq c$. The first complex oxide is oxygen-deficient, or oxygen-deficient and doped. Suitable first complex oxides include, but are not limited to, oxygen-deficient, or oxygen-deficient and doped, $BaTiO_3$, $SrTiO_3$, $PbTiO_3$, $NaCo_2O_4$, and $BiFeO_3$. In some embodiments of the invention the first complex oxide has a $ZT \geq 1.5$ at 300 K and/or $ZT \geq 15$ at 125 K.

A suitable second complex oxide for use in the present invention has the formula of the first complex oxide as defined above, or is of the formula $M^1_aM^2_bO_{c-\delta}$; wherein $M^1$ is one element selected from the group consisting of Na, K, Li, Ti, V, Cr, Mn, Fe, Ni, Cu, Zn, Pb, Ca, Sr, Ba, Al, Y, and Bi; wherein $M^2$ is one element selected from the group consisting of Ti, V, Cr, Mn, Fe, Co, Ni, Cu, Mo, W, Nb, Ta, and Ag; $M^1$ is not the same element as $M^2$; $1 \leq a \leq 4$; $1 \leq b \leq 4$; $2 \leq c \leq 10$; and $0 \leq \delta \leq c$. Suitable second complex oxides include, but are not limited to, $BaTiO_3$, $SrTiO_3$, $PbTiO_3$, $NaCo_2O_4$, and $BiFeO_3$.

Suitable La for the use in the invention are Ce, Pr, Nd, Pm, Sm, Eu, Gd, Tb, Dy, Ho, Er, Tm, Yb and Lu.

The thermoelectric system can further comprise a $LaAlO_3$ (LAO) layer between the substrate and the first layer. The LAO layer can be of a thickness of less than about 20 nm.

The present invention also provides for a device comprising the thermoelectric system of the present invention, wherein the first complex oxide substrate contacts a first electrode and a second electrode. The present invention also provides for a method of creating an electric current comprising: providing such a device, and increasing the temperature of the first electrode, such that an electric current is created that flows from the first electrode, through the substrate, and to the second electrode. The present invention provides for a thermoelectric power generator or thermoelectric cooler comprising such a device.

The present invention further provides for a composition comprising a lanthanum-doped strontium titanate having the formula $Sr_{1-x}La_xTiO_{3-\delta}$, wherein $0<x<1$, and $0\leq\delta<3$. In some embodiments of the invention, $0<x<0.04$ and/or $0<\delta<0.04$.

BRIEF DESCRIPTION OF THE DRAWINGS

The foregoing aspects and others will be readily appreciated by the skilled artisan from the following description of illustrative embodiments when read in conjunction with the accompanying drawings.

DETAILED DESCRIPTION

Before the present invention is described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "and", and "the" include plural referents unless the context clearly dictates otherwise. Thus, for example, reference to "a layer" includes a plurality of such layers, and so forth.

These and other objects, advantages, and features of the invention will become apparent to those persons skilled in the art upon reading the details of the invention as more fully described below.

Figure 8:
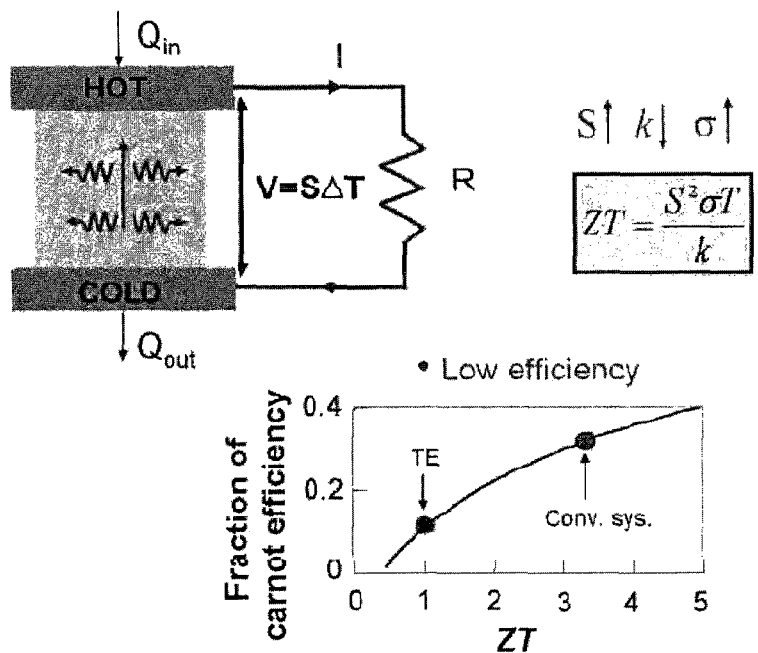
FIG. 8 shows the relationship of ZT, k and σ in regards to the efficiency of thermoelectric devices.
Figure 9:
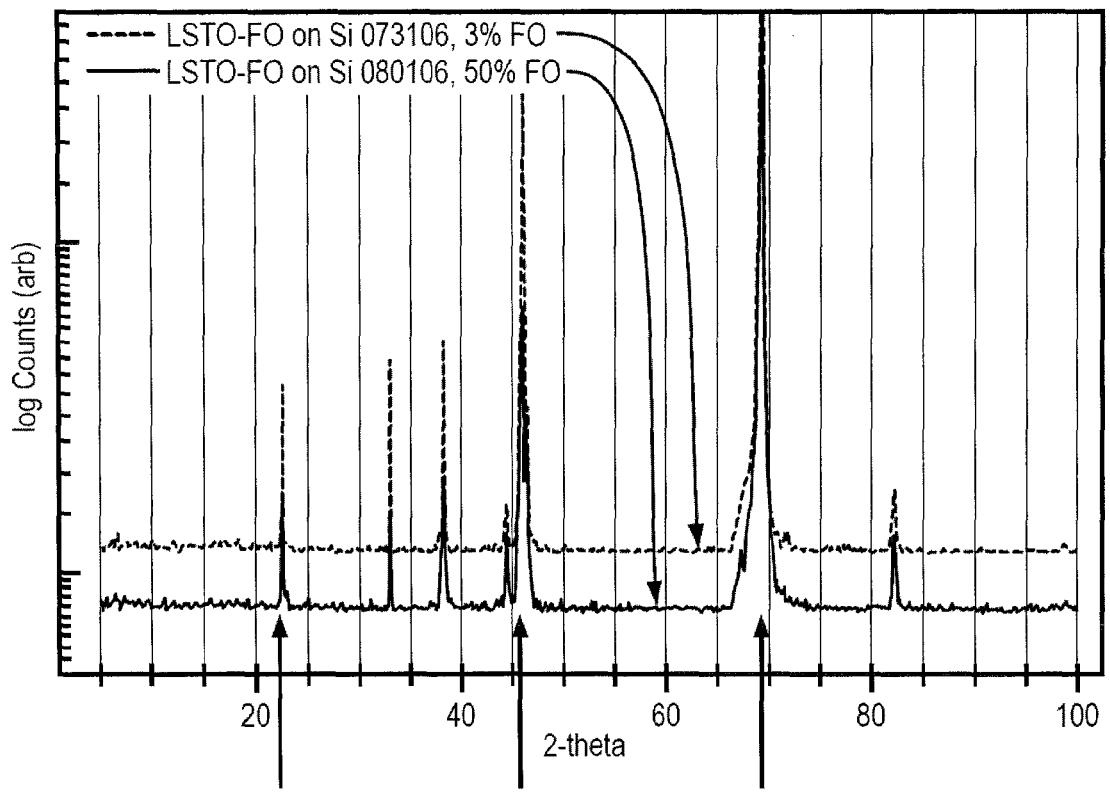
FIG. 9 shows the growth of nanostructured SLTO, specifically, epitaxial films of SLTO+$Fe_3O_4$ on both pure STO substrates and STO-on-Si substrates.

A measure of the efficiency of a thermoelectric material can be described by the thermoelectric figure of merit (often called as ZT), which is defined as $S^2\sigma/k$, where S, σ, and k are thermopower (or Seebeck coefficient), electrical conductivity, and thermal conductivity, respectively (see FIG. 8). In order to achieve high ZT, it is required to obtain large $S^2\sigma$ (called power factor), but small k. The three properties are strongly correlated—i.e., changing one parameter favorably often makes the others undesirable. In bulk materials, the increase of carrier concentration for larger σ often makes S decrease and k increase. Recently, a factor of two enhancement in ZT has been reported by mixing different elements or modifying the crystal structures of the current state-of-the-art thermoelectric alloys composed of Bismuth, Antimony, Tellurium, and Selenium. For example, ZT of p-type $Bi_2Te_3$/$Sb_2Te_3$ superlattices (R. Venkatasubramanian, E. Siivola, T. Colpitts, B. O'Quinn, Nature 413, 597 (2001)), n-type PbSeTe/PbTe superlattice (T. C. Harman, P. J. Taylor, M. P. Walsh, B. E. LaForge, Science 297, 2229 (2002)), and n-type nanodot $AgPb_{18}SbTe_{20}$ (K. F. Hsu et al., Science 303, 818 (2004)) have been reported to be ~2 at room temperature. These materials contain many interfaces or inclusions that influence phonon transport rather than electron, which results in larger suppression in thermal conductivity than electrical conductivity. In fact, these interfaces and inclusions have been found to be an effective way to suppress heat transport by phonons (G. Chen, J. Heat Transfer 119, 220 (1997); W. Kim et al., Phys. Rev. Lett. 96, 045901 (2006)). On the other hand, the investigation of complex oxides for thermoelectric applications has been relatively unexplored although the complex oxides are one of the best candidates due to their wide tunability in thermoelectric properties by doping impurities and creating oxygen vacancies. In addition, they often have a heavy effective mass of electrons that could lead to a large thermopower (W. Wunderlich, H. Ohta, K. Koumoto, ArXiv/condmat050013; H. P. R. Frederikse, W. R. Thurber, W. R. Hosler, *Physical Review a-General Physics* 134, A442 (1964)). For example, the power factor of $NaCo_2O_4$ is comparable to that of the Bismuth telluride alloy due to a moderate thermopower (~0.1 mV/K) even with a metal-like electrical conductivity (~0.2 mΩ-cm) (I. Terasaki, Y. Sasago, K. Uchinokura, *Physical Review B* 56, 12685 (1997)), but its thermal conductivity has been found to be higher than that of Bismuth telluride alloy (D. M. Rowe, Ed., *Thermoelectrics Handbook* (CRC, Boca Raton, 2006)). Here, $SrTiO_3$ is selected for further optimization of thermoelectric properties due to an extraordinary thermopower with a wide tunability in electrical conductivity. It has been reported that electrical conductivity can be drastically changed from zero to a metal-like conductivity $\sim 10^6 \Omega^{-1} m^{-1}$ at room temperature by doping various elements including lanthanum, yttrium, and niobium (T. Okuda, K. Nakanishi, S. Miyasaka, Y. Tokura, *Phys. Rev. B* 63, 113104 (2001); H. Obara et al., *Jpn. J. Appl. Phys.: Lett. & Exp. Lett.* 43, L540 (2004); S. Ohta et al., *Appl. Phys. Lett.* 87 (2005); S. Ohta, T. Nomura, H. Ohta, K. Koumoto, *J. Appl. Phys.* 97 (2005)). Furthermore, a large thermopower up to ~890 µV/K at room temperature can be obtained when $SrTiO_3$ is oxygen-deficient (Frederikse (1964)). The oxygen vacancy also increases electrical conductivity. An excess oxygen depletion, however, could collapse the lattice structure and lead to a decrease of electrical conductivity (K. Szot, W. Speier, R. Carius, U. Zastrow, W. Beyer, *Physical Review Letters* 88 (2002)). Moreover, despite a strong oxygen depletion process, a high electrical conductivity comparable to that from doping could not be achieved (Frederikse (1964)). In order to enhance the electrical conductivity further, lanthanum is used to replace the strontium site as a dopant, which released extra electrons due to the variation from $Ti^{3+}$ to $Ti^{4+}$. It is well known that orders of magnitude enhancement can easily be achieved by adding only a few percent of lanthanum instead of strontium (Okuda (2001)). The impurities could also behave as obstacles for heat transport. In combination with a low temperature synthesis process that creates defects in the lattice, the heat transport could be impeded even further. Consequently, these favorable effects brought a significant enhancement in ZT of the oxygen-deficient lanthanum-doped $SrTiO_3$. It is observed that ZT~1.6 at 300 K, and more surprisingly ZT~17 at 125 K.

$SrTiO_3$ is an insulator. La-doping with La-doping with oxygen ($O^{2-}$) vacancies of $SrTiO_3$ results in a metallic or degenerate semiconductor state of $Sr_{1-x}La_xTiO_{3-\delta}$. La-doping changes $Ti^{4+}$ to $Ti^{3+}$ and releases one electron. The creation of an oxygen vacancy releases two electrons. By combining La-doping with oxygen ($O^{2-}$) vacancies, we show here that $Sr_{1-x}La_xTiO_{3-\delta}$ grown in thin-film form on STO single-crystals can improve the overall thermoelectric properties of this material system by over a factor of ten. In addition, enormous power factors can be achieved in these thin-film materials which may offer a pathway to high-ZT. With worldwide energy and climate crises on hand, research into high-Z thermoelectric materials have re-emerged with utmost importance. As energy prices rise and thermoelectric efficiency improves, the prospect of thermoelectric energy conversion devices becoming widespread is now on the horizon. In addition, heat transport from microprocessors is becoming more often the limiting factor in improving performance. Thermoelectric Peltier devices could play a significant role in upholding Moore's law in the near future.

Complex oxides have been found to be the best candidates for widespread deployment of thermoelectric systems for one or more of the following reasons: non-toxic, inexpensive, high efficiency, wide tunability in thermoelectric properties, and large effective mass of electrons, which enhances thermopower.

In one embodiment, $SrTiO_3$ is used as a model for a wide range of complex oxides. By doping with lanthanum and intentionally making oxygen vacancies, the electrical conductivity of $SrTiO_3$ can be significantly enhanced. Meanwhile, the oxygen vacancies also play an important role in increasing thermopower as well as reducing the thermal conductivity by scattering. Furthermore, the optimization of the electrical conductivity, thermopower, and thermal conductivity for better thermoelectric performance using the above mentioned technique lead a significant enhancement in thermoelectric figure-of-merit.

In one embodiment, highly efficient thermoelectric materials are developed from complex oxides by tuning material properties. It is usually difficult to increase thermoelectric figure-of-merit due to the strong correlation between three thermoelectric properties, i.e, electrical conductivity, thermopower, and thermal conductivity. In order to achieve high figure-of-merit, it is required to obtain high electrical conductivity, high thermopower, and low thermal conductivity. However, it has been very challenging to achieve them at the same time due to the intrinsic nature of electron transport. For example, when the electrical conductivity increases, the-mopower decreases and thermal conductivity increases. In one embodiment, electrical conductivity and thermopower increase at the same time by doping complex oxides with lanthanum and introducing oxygen vacancies. In addition, the thermal conductivity is also reduced by scattering due to the defects and impurities created by the doping, the vacancies, and a low temperature growth process. Thus a high thermoelectric-figure-of merit can be achieved, overcoming many drawbacks of current state-of-the-art thermoelectric materials and conventional energy conversion systems as described above.

In one embodiment extremely high power factors were achieved when SLTO was grown on an STO substrate. Extreme care was taken to ensure that contributions from the underlying STO did not convolute the measurement of the SLTO film properties; in fact, it was determined that the STO substrate almost always played a role when an SLTO film is grown directly on it. It has recently been shown that oxygen vacancies formed during film growth in STO can convolute transport properties on interfaces, likewise, this can occur for resistivity and thermopower measurements on our thin-films. In-situ across-sample resistance measurements during film growth confirmed that it is in fact the film itself which activates the reduction of the STO substrate. STO annealed under identical thermal and temporal conditions to those during film growth, but without film growth, will not reduce appreciably. However, growing films at pressures lower than $10^{-4}$ Torr at elevated temperatures reduces the substrate, which is optically darker than non-reduced STO upon completion of the growth process and can have a backside sheet resistance $R_s$ as low as several ohms.

Figure 6:
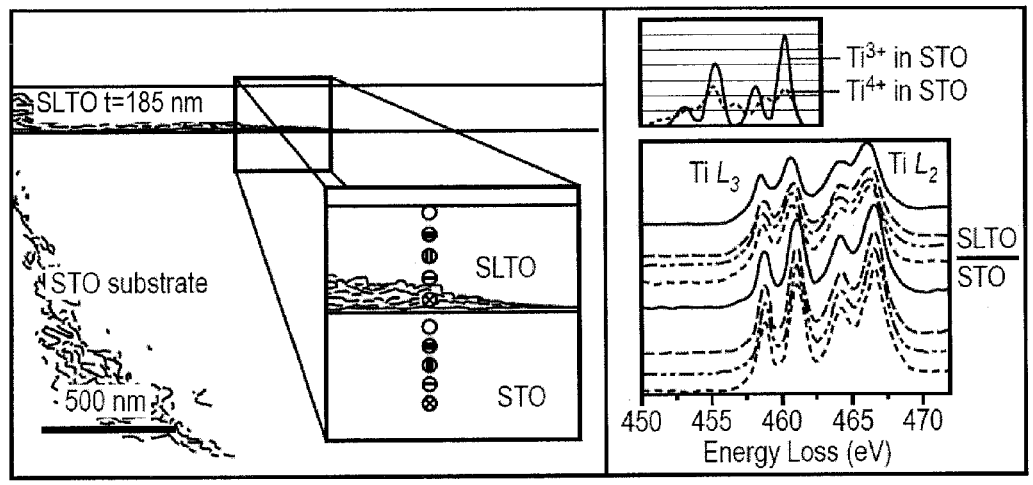
FIG. 6 shows the TEM, EELS on SLTO films and STO substrate. With an EELS detection limit of >1% and no discernable $Ti^{2+}$ in the substrate, the oxygen vacancy concentration in the STO must be less than $10^{21}$ cm$^{-3}$.
Figure 7:
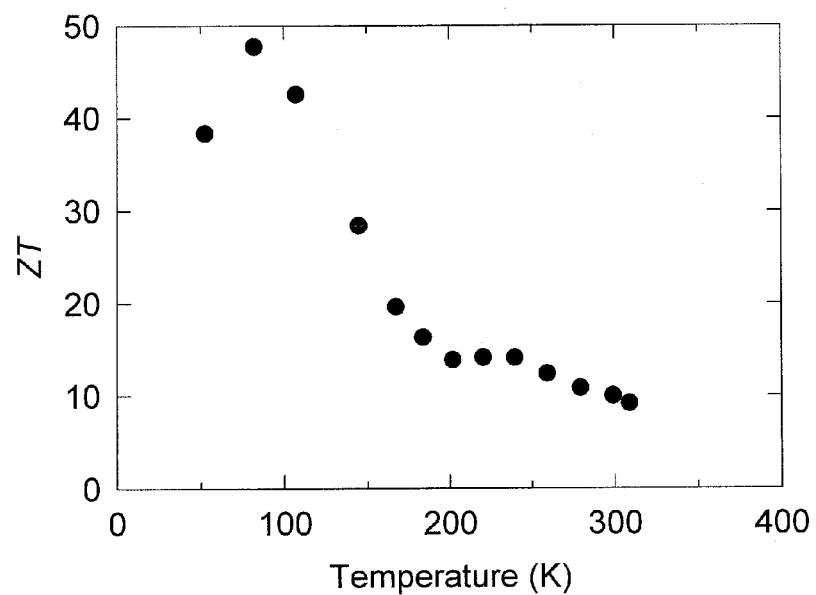
FIG. 7 shows that ZT is a measure of the efficiency of the thermoelectric devices or systems. The efficiency of conventional systems corresponds to approximately ZT of 3. In the La-doped $SrTiO_3$ materials, ZT is extremely high at room temperature and even higher at low temperature.

In one embodiment, to mitigate the reduction of the STO substrate during film growth and in turn diminish the substrate contribution to transport measurements, SLTO films were grown at 450° C. A low oxygen partial pressure of $p_{O2}=2\times10^{-7}$ Torr (except in the case of a varied-pressure series of samples) was used to ensure the films were oxygen-deficient. Electron energy-loss spectra (EELS) of a typical SLTO/STO film/substrate (FIG. 6) indicates that our films are oxygen deficient with respect to the substrate, but with an EELS edge detection limit of ~1% concentration, the substrate still may be substantially doped with carriers since a mere 0.1% oxygen vacancy concentration will yield roughly $10^{20}$ electrons/cm$^3$. Tunneling-AFM (TUNA) current data on SLTO/STO indicates that while the resistivity of the film is at least 30× that of the substrate for the data shown (in fact at least 300× when using Pt-coated AFM tips), the fact that the substrate (t=500 μm) is 5000× thicker than a typical film (t=100 nm) means that more conduction may be occurring in the substrate than in the film during resistivity and thermopower measurements.

In one embodiment, to reduce or eliminate any contribution from the substrate, a thin (5-20 nm) LAO layer was grown beneath the SLTO film via Laser-MBE to prevent oxygen diffusion out of the STO. LAO was effective in blocking oxygen diffusion since both Lanthanum and Aluminum can only exist in the 3+ oxidation state, whereas Ti in STO can readily go from 4+ to 3+ and in turn electrostatically allow the presence of oxygen vacancies.

SLTO growth on a layer of LaAlO$_3$ (LAO) that was <20 nm in thickness on an STO substrate was necessary to achieve films with good thermoelectric properties. The thickness of the LAO layer was chosen so as to be thick enough to prevent oxygen diffusion while still thin enough for the LAO to be fully strained to the STO substrate, allowing the SLTO films to remain quasi-homoepitaxial and high-quality. RHEED oscillations were seen with good intensity for the duration of SLTO film growth on <20 nm LAO, indicating highly crystalline films growing two-dimensionally.

Measurements such as spreading probe or c-v show that oxygen diffusion out of the substrate does not increase the conductivity below the film appreciably. Using an LAO underlayer thus effectively isolates the SLTO film during transport measurements and allows for accurate determination of the film's thermoelectric properties.

The thermopower S of samples grown at various thicknesses with and without an LAO underlayer and on various substrates has been measured. A measured thermopower on the film surface is a sum of the thermopowers in the layers of the structure underneath (resistors in parallel), weighted by their respective conductances $G=1/R_s$. Although the LAO/STO interface is a known high-mobility interface, the $R_s$ value of this interface (6500Ω/☐)is still very large compared to that of the SLTO film (on the order of 100Ω/☐)and so will have a negligible contribution to the thermopower. On a control sample of 10 nm LAO on STO, we measured S=0.47 mV/K, with an $R_s$ of 700 kΩ/☐Likewise, a substrate $R_s$ of ~100 MΩ/☐ as measured on the backside (in addition, add spreading probe or CV data here) indicates that the substrate contribution to thermopower is almost zero. It may be that both any LAO/STO interface effects and the substrate will not significantly convolute the transport measurements of the SLTO films, Assuming a thermopower in the bulk STO substrate to be a maximum of 0.8 mV/K$^1$, the thermopower of the film can be extracted from the measured thermopower and will differ by at most ~1% from the measured value.

The electrical resistivity of the SLTO films can likewise be convoluted in measurement due to the large conduction volume of the substrate despite its relatively low resistivity. During a 4-point measurement the film/substrate system may be effectively modeled as resistors in parallel, and a resistance of roughly one order of magnitude greater in the substrate than the film introduces less than 5% measurement error into the resistivity measured from the sheet resistance $R_S$. A resistance difference of several orders of magnitude was achieved through the use of the LAO underlayer, as was confirmed by spreading probe and by grinding off ~50 μm or more of the film plus substrate and measuring $R_S$ this far below the film.

When shows thermopower is plotted as a function of Oxygen growth pressure, it seems that as more oxygen vacancies are added to the film, both electrical conductivity and thermopower increase to give very high power factors.

The c-axis lattice parameter of the films is distorted relative to that of the bulk (SLTO film c=3.9460 Å, a=3.9057 Å; STO bulk c=a=3.9056 Å), and x-ray diffraction (XRD) shows that all films grown under the presented conditions have a high degree of crystallinity (SLTO 002 full-width-at-half-maximum=0.125°) out to thicknesses as high as 1000 nm. Additionally, high-resolution transmission electron microscopy (HRTEM) verifies that the SLTO films are homoepitaxial with the STO substrate.

Films were also grown on substrates of $(La_{0.18}Sr_{0.82})(Al_{0.59}Ta_{0.41})O_3$ (001), LaAlO$_3$ (100), DyScO$_3$ (100), NdGaO$_3$ (110), and STO/Si (100), with lattice parameters of 3.79 Å, 3.86 Å, 3.94 Å, and $(110_{Si})$=3.84 Å, respectively. The measured thermopower of films on these substrates were at best half that of those on STO or STO/LAO, and film quality was also considerably worse as indicated by broader XRD film peaks and the presence of other cubic phases with similar lattice parameters.

The thermoelectric system of the present invention can be synthesized in any suitable method. Such methods include the methods described in Example 1 and 2 described herein.

The device of the invention can be a thermoelectric power generator or thermoelectric cooler. The device of the invention can be used for thermoelectric power generation or thermoelectric cooling, such as for computer chip cooling.

The invention having been described, the following examples are offered to illustrate the subject invention by way of illustration, not by way of limitation.

Example 1

SrTiO$_3$ (STO) is a cubic perovskite (Pm3m) with a bulk lattice parameter of 3.9056 Å. Out-of-plane lattice parameters of the films were characterized via x-ray diffraction using a Panalytical X'Pert MRD Pro 4-circle diffractometer for θ-2θ and rocking curve (ω) scans. All SLTO films grown were slightly distorted (~1%) with the c-axis measuring 3.946 Å for typical 100 nm thick films.

TEM characterization and electron energy-loss spectroscopy (EELS) were performed on an FEI Tecnai F20 equipped with a high-angle annular dark-field (HAADF) detector. The quasi-homoepitaxial films ($a_{SLTO\ bulk}$=3.9057 Å) exhibited smooth surfaces and flat interfaces with the substrate, and maintained uniform thicknesses through the entire specimen. STEM EELS was performed across the SLTO/STO interface with an energy resolution of 0.7 eV.

In addition, RHEED pattern intensity oscillations of the STO 001 peak were visible throughout the growth of films to thicknesses of nearly 200 nm.

Targets, Substrates, PLD

Pulsed-laser deposition (PLD) targets were stoichiometric and provided by Praxair . . .

Both STO (100) single-crystal substrates for PLD growth and Sr$_{0.98}$La$_{0.02}$TiO$_3$ (100) single-crystals for bulk studies were supplied by Crystec.

Films were grown via pulsed-laser deposition (PLD) or Laser-molecular beam epitaxy (Laser-MBE) at a 10 Hz laser repetition rate with energy density of ~2 J/cm$^2$ for 10 minutes in the case of PLD-grown samples, and 1 Hz at 1.8 J/cm$^2$ for 60 minutes in the case of Laser-MBE-grown samples.

Tuna

Nanoscale conductivity measurements were performed on a Digital Instruments Nanoscope-IV Multimode AFM equipped with a conductive-AFM application module (TUNA{TM}). Using conductive AFM tips it is possible to measure local electrical and topographical properties both simultaneously and independently. The investigations were performed with commercially available Pt-coated Si-tips (MikroMasch) and nitrogen doped diamond coated Si-tips (NT-MDT). Current amplification settings of the C-AFM equipment of 1V/pA and 10V/pA at an applicable voltage range of +−12V were used. For a typical scan rate of 0.5 to 1.0 microns per second, the noise level was of the order of 50 fA at a bandwidth of 250 Hz. All data were acquired under ambient conditions and at room temperature. Cross-sectioned samples were produced by cutting in half the original 5×5 mm sample and gluing the halves together with a cyanoacrylate-based glue (Superglue). Local surface roughness below 3 nm rms was achieved by dry mechanical polishing using diamond lapping film.

Thermoelectric Measurements

Because STO is a well-known thermoelectric with high thermopower, deconvoluting the transport in the substrate from the transport in the film must be done carefully and thoroughly. To facilitate this, transport (4-point Van der Pauw sheet resistance and thermopower) was measured on both the film and backside of the substrate after film growth for every sample.

Example 2

A laser molecular beam epitaxy (MBE) is used to deposit 50-nm-thick Lanthanum-doped $SrTiO_3$ films from a target containing SrO, $TiO_2$, and $La_2O_3$ on 5 mm×5 mm×500 μm single-crystalline $SrTiO_3$ substrates with a 10-nm-thick $LaAlO_3$ buffer layer. During the deposition, the substrate is kept at a temperature and a vacuum pressure of 450° C. and ~$10^{-7}$ Torr, respectively. The sample is cooled at about 10° C./min and the pressure is maintained throughout the entire process. The laser energy density, the repetition rate, and the deposition rate are ~1.6 J/cm², and 1 Hz, respectively. The vacuum pressure is high enough to produce oxygen-deficient, $Sr_{1-x}La_xTiO_{3-\delta}$ ($\delta>0$) films. The substrate is prepared by depositing a fully strained 10-nm $LaAlO_3$ buffer layer on $TiO_2$-terminated (001) $SrTiO_3$ at 850° C. and ~$0.75\times10^{-4}$ Torr. When the substrate is cooled after the $LaAlO_3$ deposition, oxygen is purged into the chamber till atmospheric pressure. This minimize the oxygen vacancies that might be created during the buffer layer growth. The $LaAlO_3$ buffer layer plays an important role in preventing oxygen diffusion considerably during the film growth since the $LaAlO_3$ barely reduced due to the invariance of 3+ state of aluminum. When a $Sr_{1-x}La_xTiO_{3-\delta}$ film is deposited directly on a bare $SrTiO_3$ substrate, the oxygen in the substrate is strongly reduced. The back side of the substrate is very conductive even after the film is completely removed. The oxygen-deficient film is responsible for the substrate reduction. When bare $SrTiO_3$ is annealed without a film deposition under the same temperature and pressure as those of the film growth process, no such electrical conductance in the substrate is observe. The relatively low growth temperature can reduce activation energy for oxygen diffusion out of a substrate so that substrate reduction is minimize. In addition, low temperature growth creates defects in $Sr_{1-x}La_xTiO_{3-\delta}$ films, which result in suppression of thermal conductivity.

Figure 1:
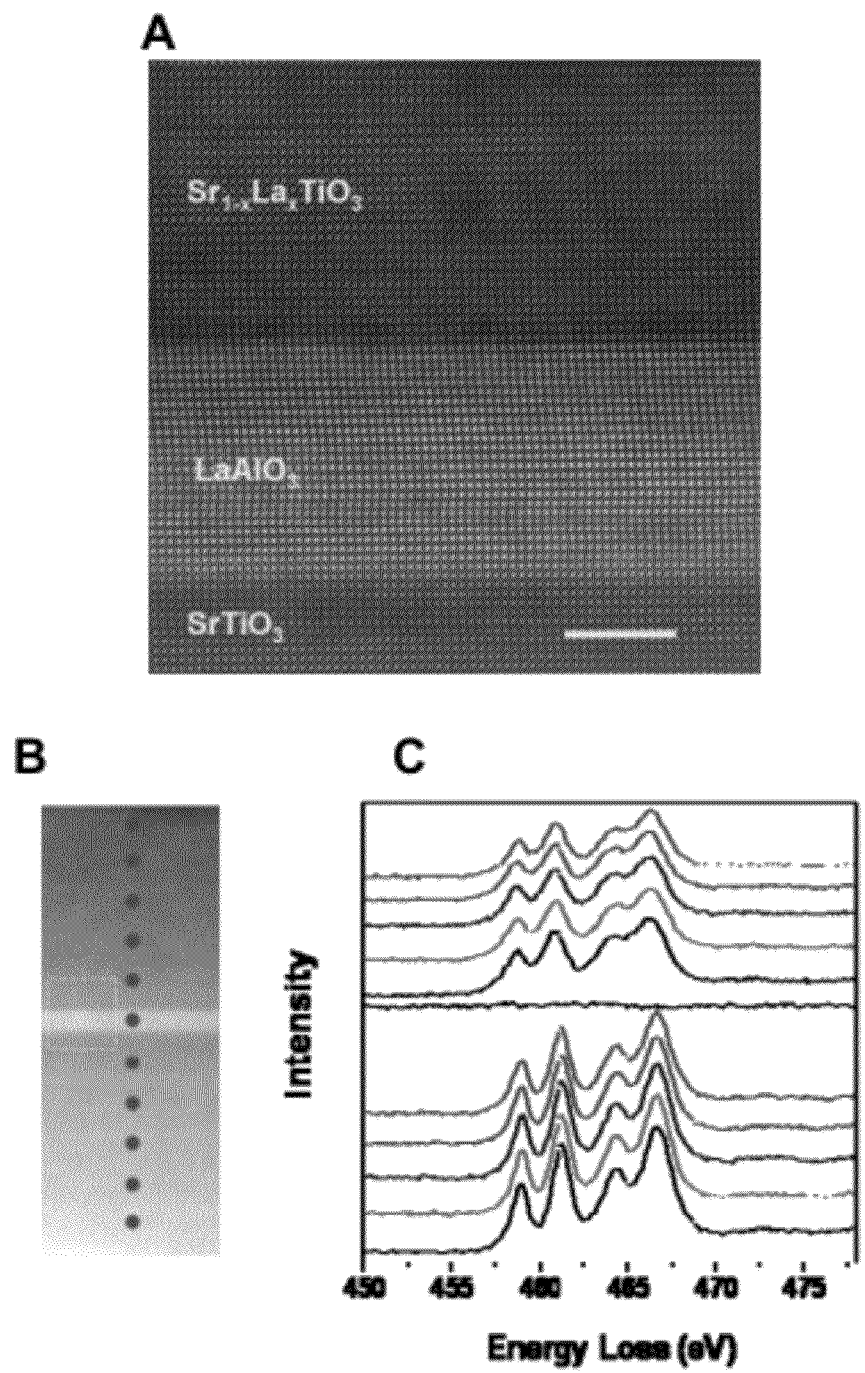
FIG. 1 shows a high resolution TEM of the film, the buffer layer, and the substrate (Panel A); a low magnification TEM (Panel B); and the results of an EELS interrogation (Panel C). In Panel A, the scale bar is 5 nm. The square box (dotted line) in Panel B represents the area shown in Panel A. In Panel B, the dots indicate the interrogation location for the EELS, the results of which are shown in Panel C.

FIG. 1 shows a high resolution transmission electron micrograph (TEM) and an electron energy loss spectra (EELS) of a typical $Sr_{1-x}La_xTiO_{3-\delta}$ film on $LaAlO_3/SrTiO_3$ substrate obtained by an FEI Tecnai F20 equipped with a high-angle annular dark-field (HAADF) detector. The low temperature growth is sufficient to produce epitaxial films. In addition, reflection high energy electron diffraction (RHEED) intensity oscillations of $Sr_{1-x}La_xTiO_{3-\delta}$ (001) peak are visible throughout the growth of the film. As shown in FIG. 1 (Panel C), the convoluted $Ti^{3+}$ and $Ti^{4+}$ EELS of the film indicate that the film is more oxygen-deficient than the substrate (D. A. Muller, N. Nakagawa, A. Ohtomo, J. L. Grazul, H. Y. Hwang, *Nature* 430, 657 (2004); A. Ohtomo, D. A. Muller, J. L. Grazul, H. Y. Hwang, *Nature* 419, 378 (2002)). However, it is difficult to find the amount of Oxygen deficiency ($\delta$) in the film and the substrate due to the detection limit of EELS. The variation of $\delta$ could be ~0.05 (Muller (2004)) and cause a large error in carrier concentration of ~$10^{21}$ cm$^{-3}$. Rutherford back scattering (RBS) analysis of a typical film, and lanthanum concentration, indicate x to be ~0.022.

In-plane electrical property measurements are performed in a vacuumed variable-temperature cryostat after a thin layer of chromium/gold films is evaporated on the four corners of the film. During the metal evaporation, chamber pressure is maintained at ~$10^{-6}$ Torr in order to avoid oxidizing the film. Current-voltage sweep measurements indicate that the contacts between the metal and the oxide film are ohmic. The Van der Pauw method (W. R. Runyan, T. J. Shaffner, *Semiconductor Measurements & Instrumentation* (McGraw-Hill, New York, ed. 2, 1998)) is used to obtain electrical resistivity ($\rho=1/\sigma$) from sheet resistance ($R_s$) measurement. The resistivity can be calculated from the relation, $\rho=R_s \cdot t$, where t is the thickness of a conducting layer. For thermopower measurement, the sample is mounted between two thermoelectric devices, and T-type thermocouples on both edges of the sample. The thermoelectric voltage generated across the sample is recorded using the copper leads of the thermocouple as the temperature difference between the two edges is increased from 0 to ±5~10 K. The thermopower is determined by the linear fitting of the thermoelectric voltage as a function of the temperature difference. The thermopower of Copper is ~1.83 μV/K at 300 K and is no greater than a few μV/K for our measurement temperature range of 20-400 K (D. M. Lowe, Ed., *CRC Handbook of Thermoelectrics* (CRC Press, Boca Raton, Fla., 1995), pp. 390-391). The thermoelectric voltage across the copper leads generated from ~10 K temperature difference is assumed to be negligible compared with measured thermoelectric voltages up to several mV.

The substrate influences the measurement. Care is taken in finding thin film properties due to the contribution from the substrate that is usually several orders of magnitude thicker than the film. This implies that the sheet resistance of the film and the substrate could be comparable even though the resistivity of the substrate is several orders higher than that of the film. For example, $R_{s,film}$ from $\rho_{film}=5$ mΩ-cm and $t_{film}=50$ nm is comparable to $R_{s,substrate}$ from $\rho_{substrate}=2000 \cdot \rho_{film}=10^4$ mΩ-cm and $t_{substrate}=100$ μm. This substrate resistivity is easily reached by a slight doping of ~$10^{17}$ carriers per cm$^{-3}$, which needs only ~$10^{-4}$% Oxygen vacancy if mobility falls ~6 cm²/V-s (Okuda (2001)). In order to subtract the substrate contribution, three layers—the film, the insulating buffer layer, and the substrate—are connected in parallel, and electron transport occurred only through the film and the substrate. The length of the sample is substantially longer than the thickness of the sample. The film properties are measured using the sheet resistance and the thermopower before and after removing the film. The resistivity of the film, $\rho_{film}$ is obtained from the relation, $t_{film} \cdot (1/R_{s,hetero}-1/R_{s,substrate})^{-1}$. Similarly, the thermopower of the film, $S_{film}$ is expressed as $R_{s,film} \cdot [S_{hetero}(1/R_{s,film}+1/R_{s,substrate})-S_{substrate}/R_{s,substrate}]$ where $R_{s,hetero}$ and $S_{hetero}$ are respectively the sheet resistance and the thermopower due to both the film and the substrate. This method has been used for determining the electrical properties of heterostructures (T. Koga, S. B. Cronin, M. S. Dresselhaus, J. L. Liu, K. L. Wang, *Applied Physics Letters* 77, 1490 (2000); H. W. Hillhouse, M. Tuominen, *Microporous and Mesoporous Mater.* 47, 39 (2001); H. Ohta et al., *Nature Materials* 6, 129 (2007)).

Figure 2:
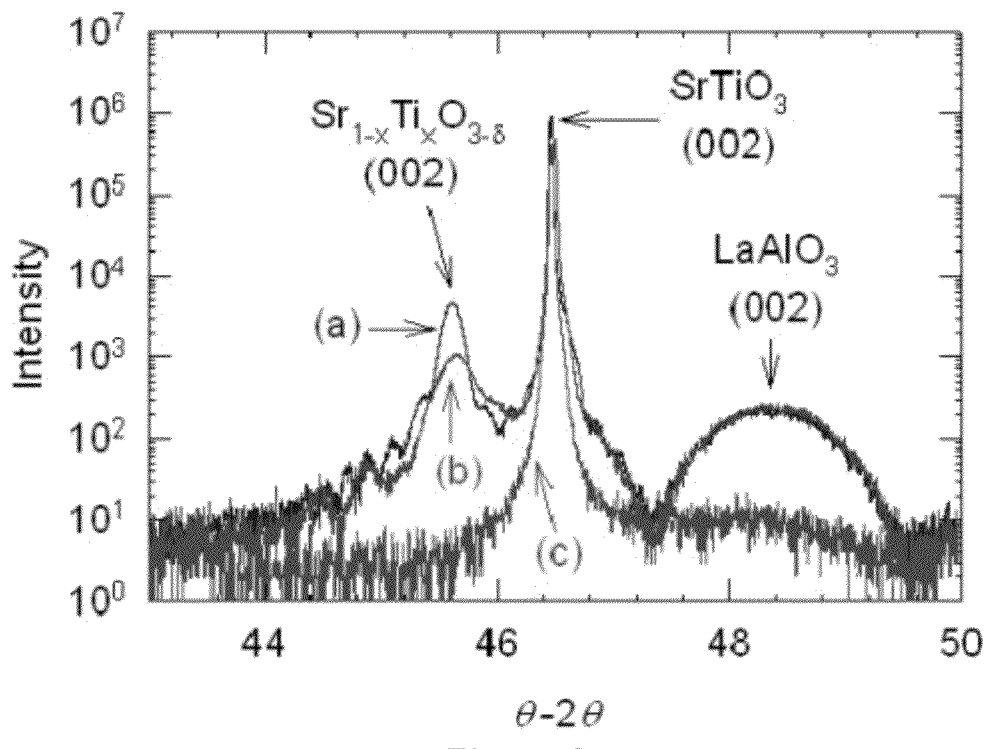
FIG. 2 shows an X-ray diffraction of an as-grown sample (a), after removing a half of the film (b), and after removing the whole film and a part of the buffer layer (c).

A mixture of fluorine and chlorine based acids is used remove the film. The crystallinity of the film is ensured by performing X-ray diffraction analysis as the film is etched. FIG. 2 (line a) shows the diffraction of an as-grown sample. The diffraction after removing a half of the film suggests that the film and the buffer layer maintain a good crystallinity (FIG. 2, line b). The subsequent etch removes the rest of the film and a part of the buffer layer (FIG. 2, line c). The etch depth is confirmed by the step height analysis of a small portion of the film protected by a photoresist during the etch process. The lattice constant and the structure of a stoichiometric $SrTiO_3$ are 3.905 Å and a cubic perovskite, respectively. Out-of-plane lattice constant of the film is calculated to be 3.975 Å. The c-axis distortion is due to oxygen vacancies and Lanthanum-doping. No in-plane distortion in the film is observed.

Figure 3:
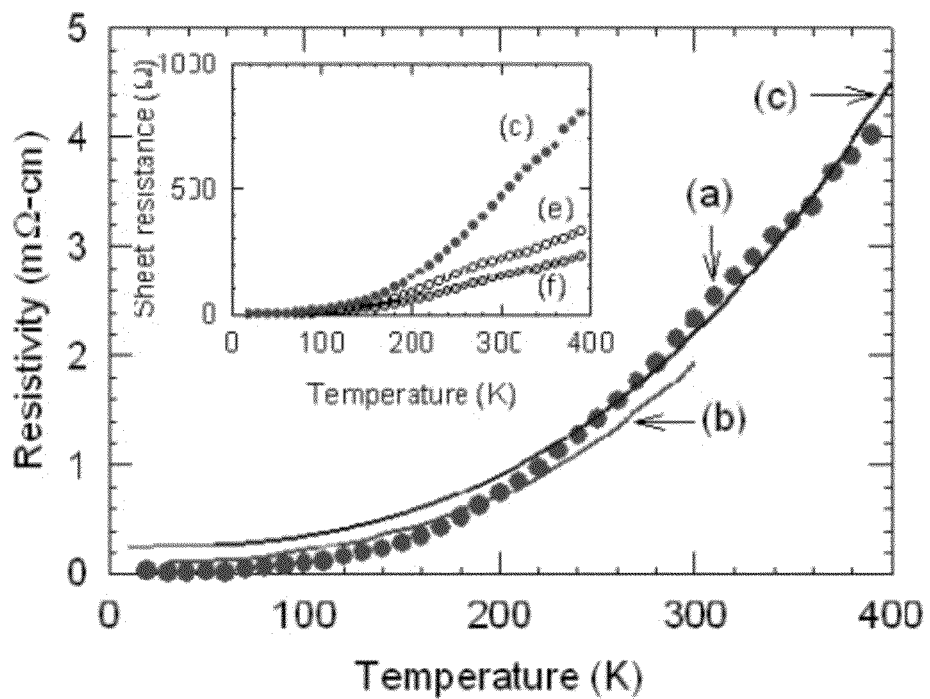
FIG. 3 shows the film resistivity of $Sr_{1-x}La_xTiO_{3-\delta}$ (a, filled circles), the resistivity of single crystal bulk $Sr_{0.98}La_{0.02}TiO_3$ from Okuda et al. (2001) (b, line), the calculated resistivity from the mobility (c, line). The inset shows the sheet resistances of the film (d, filled circles), after removing the film (e, open circles), before removing the film (f, shaded circles).

The resistivity of a $Sr_{1-x}La_xTiO_{3-\delta}$ film (FIG. 3, line a) is plotted as a function of temperature with the measurement result of a $Sr_{0.98}La_{0.02}TiO_3$ (FIG. 3, line b) bulk from Okuda et al. (2001). One of the most evident differences between this film and the bulk would be the concentration of the Oxygen vacancy. In general, resistivity decreases as vacancy concentration increases. Nevertheless, the two measured resistivity match. The carrier concentration and mobility of the film are estimated to be $\sim 5 \times 10^{20}$ cm$^{-3}$ and $\sim 5.6$ cm$^2$/V-s at room temperature from the sheet carrier concentration of the film, $n_{s,film} (= n_{s,hetero} - n_{s,substrate})$ obtained by Hall measurements. The mobility of $Sr_{1-x}La_xTiO_{3-\delta}$ is expressed as $\mu(T) = (2.5 \times 10^{22})/(8.1 \times 10^{14} \cdot T^{2.7} + n_{film})$, where $\mu(T)$, T, and $n_{film}$ are mobility, temperature, and carrier concentration in the unit of cm$^2$/V-s, K, and cm$^{-3}$, respectively. The experimental data (red circles) are reasonably well fitted to the calculated resistivity (FIG. 3, line c) from the relation, $\rho_{cal} = (q \cdot n_{film} \cdot \mu(T))^{-1}$, where q is an electron charge, as $n_{s,film}$ is almost constant in our measurement temperature (Frederik. Hp, W. R. Hosler, *Physical Review* 161, 822 (1967)). In order to ensure no parasitic effects from the etch and the buffer layer, the sheet resistance of an etched $SrTiO_3$ and a $LaAlO_3/SrTiO_3$ substrate is measured. It has been reported that a dry-etch such as an ion milling of $SrTiO_3$ could damage the surface and induce a few nm conducting layer due to the oxygen vacancy that created by ion bombardment (D. S. Kan et al., *Nature Materials* 4, 816 (November, 2005)). However, the resistance of a $SrTiO_3$ after the wet-etch process is higher than 10 GΩ. This value is significantly larger than the resistance of our film and substrate as shown in the inset of FIG. 3. Furthermore, the resistivity of the film is overestimated if the etch process creates a conducting layer. The sheet resistance of the $LaAlO_3/SrTiO_3$ substrate is measured to be larger than ~50 kΩ, which is a few orders higher than the resistance of the film in question.

Figure 4:
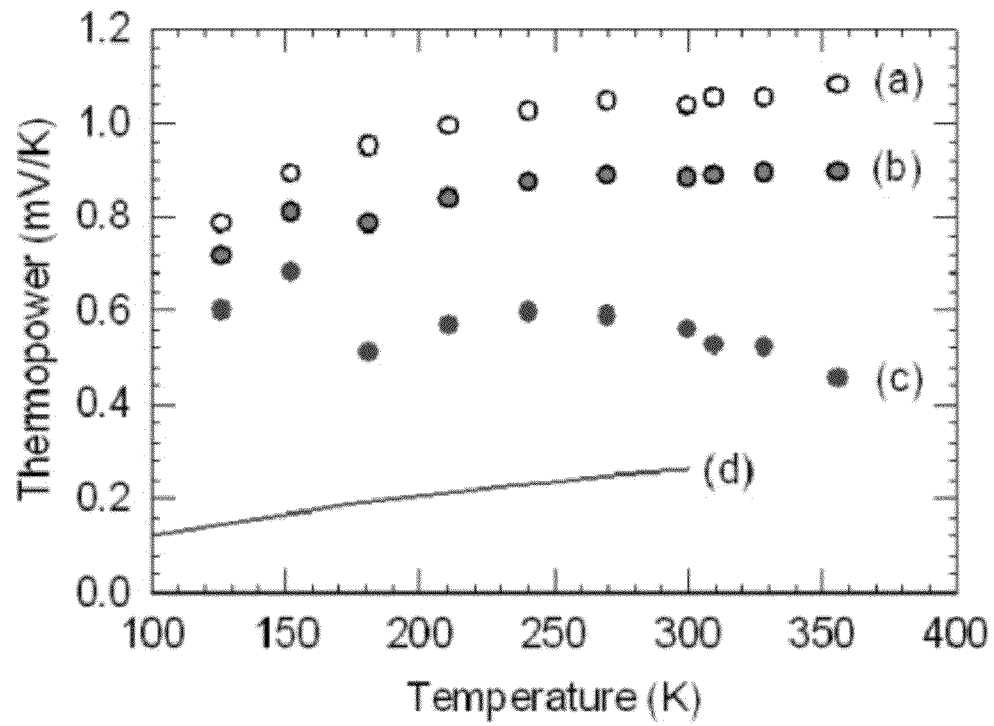
FIG. 4 shows the absolute values of the thermopower of the substrate (a, open circles), the film and the substrate (b, shaded circles), the film (c, filled circles). The line (d) indicates the interpolated thermopower of single crystal bulk $Sr_{0.98}La_{0.02}TiO_3$ from Okuda et al (2001).

The thermopower of the film is plotted in FIG. 4, line c with those from the substrate (FIG. 4, line a) and a combination of the film and the substrate (FIG. 4, line b). The sign of the thermopower indicated that the film is n-type. It is the large thermopower enhancement that is noticeable for the oxygen-deficient film. This is manifested by comparing the thermopower of $Sr_{0.98}La_{0.02}TiO_3$ from Okuda et al (FIG. 4, line d) (Okuda (2001)). Frederikse et al. disclose that a large thermopower could be attributed to a heavy electron effective mass (m*), $12 \cdot m_0 \sim 16 \cdot m_0$ at 300 K, where $m_0$ is an electron rest mass (Frederikse (1964)). According to a band structure calculation, an effective mass could be increased due to an additional flattened donator band and a tetragonal distortion with a longer c-axis that could originate from oxygen vacancy. An effective mass is estimated from the following relations.

$$m^* = \frac{h^2}{2k_BT}\left(\frac{n_{film}}{2\pi z F_{1/2}(\eta)}\right),$$

$$F_r(\eta) = \int_0^\infty \frac{x^r}{1+e^{x-\eta}}\,dx,$$

and $$S = -\frac{k_B}{q}\left(\frac{(r+2)F_{r+1}(\eta)}{(r+1)F_r(\eta)} - \eta\right),$$

where h, $k_B$, and $\eta$ are Planck and Boltzmann constants, and the reduced chemical potential. The degeneracy, z is 6. The carrier scattering parameter, r is defined as $\tau = \tau_0 \epsilon^{r-1/2}$, where $\tau$ is relaxation time (V. I. Fistul, *Heavily Doped Semiconductors* (Plenum, New York, 1969)). When r=2.2 from $\mu(T) \sim T^{-2.7}$, the effective mass is $\sim 16.7 \cdot m_0$ at 300 K.

The eminent thermopower near 150 K. Similar spikes in thermpower have been observed for bulk $SrTiO_3$ and Nb-doped $SrTiO_3$ due to phonon drag (Frederikse (1964); Okuda (2001); Ohta (2007)). Ohta et al. (2007) show that the peak temperature moves towards higher temperature as carrier concentration increases. In addition, large thermopower, ~1 mV/K and ~0.49 mV/K at 300 K are obtained from a heterointerface of $TiO_2/SrTiO_3$ and from one unit cell of $SrTi_{0.8}Nb_{0.2}O_3$ confined by $SrTiO_3$. Incidentally, the peak temperature of the $SrTi_{0.8}Nb_{0.2}O_3$ is close to that of the film in question. Whether these films have such interfaces, they do not significantly affect the properties of relatively thick film (~50 nm) due to the extremely small thickness of the interface (~0.39 nm). For example, despite low electrical resistivity (~0.43 mΩ-cm) calculated from carrier concentration of 2.4× $10^{21}$ cm$^{-3}$ in the $SrTi_{0.8}Nb_{0.2}O_3$, the sheet resistance is ~11 kΩ. This resistance is considerably larger than that of our film. In this case, the most of electron transport occurs through less resistive paths—the film rather than the interface. It is also evident that the interface effect would be negligible from the relation for $\rho_{film}$ and $S_{film}$ as described herein.

The out-of-plane thermal conductivity of 50~500-nm-thick $Sr_{1-x}La_xTiO_{3-\delta}$ films is measured since there is no readily available measurement technique for the in-plane thermal conductivity of a thin film. It is reasonable to consider that the in-plane and the out-of-plane thermal conductivity are similar due to the homogeneity of the single-crystalline film and substantially shorter phonon mean free path than the thickness of the film. The length of the mean free path is estimated to be less than ~1.6 nm at room temperature as sound velocity is ~8000 m/s of a bulk $SrTiO_3$. A differential 3ω method (D. G. Cahill, *Rev. Sci. Instr.* 61, 802 (1990); T. Borca-Tasciuc, A. R. Kumar, G. Chen, *Rev. Sci. Instr.* 72, 2139 (2001)) and a thermoreflectance method (D. G. Cahill, *Review of Scientific Instruments* 75, 5119 (2004)) are used. The 3ω method assumes that heat does not spread in a film along the in-plane direction. This suggests that the thermal conductivity of a substrate should be much larger than that of a film. In order to comply this requirement, two films grown on Silicon substrates with a 10-nm-thick $SrTiO_3$ buffer layer deposited epitaxially by using MBE are prepared (Z. Yu et al.,

*Journal of Vacuum Science & Technology B* 18, 1653 (2000)). A slow cooling rate of less than 1° C./min for the Silicon substrate samples is used to avoid deteriorating the film quality due to thermal expansion coefficient mismatch. Five different samples—a stoichiometric bulk $SrTiO_3$, 500-nm-thick $Sr_{1-x}La_xTiO_{3-\delta}$ films on Silicon substrates grown at 650° C. and 450° C., 100- and 50-nm-thick $Sr_{1-x}La_xTiO_{3-\delta}$ films on $SrTiO_3$—are used.

Figure 5:
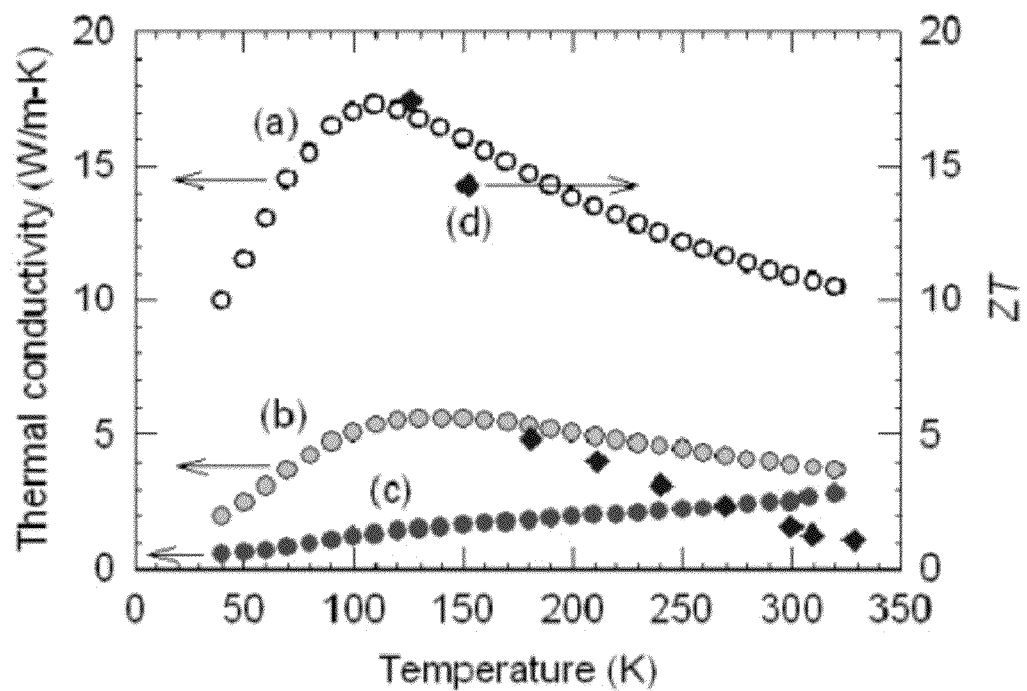
FIG. 5 shows thermal conductivities of a single crystal bulk $SrTiO_3$ (a, open circles), $Sr_{1-x}La_xTiO_{3-\delta}$ films grown at 650° C. (b, shaded circles) and 450° C. (c, filled circles). The single circle (near the lower right corner of the graph) indicates the thermal conductivity of 100-nm-thick film.

The lanthanum and oxygen vacancies suppress thermal conductivity as well as increase the power factor (i.e., both enhance ZT). As shown in FIG. 5, line b, the thermal conductivity of $Sr_{1-x}La_xTiO_{3-\delta}$ films grown at 650° C. is significantly suppressed in contrast to the bulk thermal conductivity (FIG. 5, line a). Two dominant opposite effects on thermal conductivity from the impurities could be expected. The thermal conductivity decreases due to the scattering, but it increases due to enhanced electrical conductivity. The scattering appears more influential. Similar suppression from yttrium dopants (Obarra (2004)) and oxygen vacancies (H. Muta, K. Kurosaki, S. Yamanaka, *J. Alloys and Compounds* 392, 306 (2005)) have been previously reported. The huge reduction in thermal conductivity could be attributed to effective phonon scattering due to the randomly distributed impurities. Kim et al. (2006) demonstrated that randomly distributed ErAs impurities most effectively reduced the thermal conductivity of an $In_{0.53}Ga_{0.47}As$ alloy. In addition, the atomic-size impurities can also be effective scatterers due to the short wavelength of dominant phonons since a scattering cross section is $\sim d^6/\lambda^4$, where d and $\lambda$ are an impurity size and a phonon wavelength. At low temperature, a dominant phonon wavelength could be estimated to be on the order of a few nm or less from the phonon spectrum, $D(v) \times f_{B-E}$, where $D(v)$, v, and $f_{B-E}$ are the phonon density of states from Debye approximation, phonon frequency, and the Bose-Einstein statistics. Further suppression is observed when a film is grown at lower temperature (FIG. 5, line c). This would be due to structural defects or clustered impurities (Muller (2004)) that scatter mid- and long-wavelength phonons. The strong scattering mechanisms would be responsible for the shift of the peak temperature from ~110 K (FIG. 5, line a) towards a temperature above 300 K (FIG. 5, line c). The similar electrical resistivity of $Sr_{1-x}La_xTiO_{3-\delta}$ and $Sr_{0.98}La_{0.02}TiO_3$ might also suggest the strong scattering that impedes electron transport as well as phonon transport. Note that Silicon substrates do not get reduced while different vacancy concentration in a $SrTiO_3$ substrate induced by different growth temperature could result in dissimilar vacancy concentration in a film. In order to confirm the results for the film on the Si substrate, we performed the thermal conductivity measurement of 100-nm- and 50-nm-thick $Sr_{1-x}La_xTiO_{3-\delta}$ films grown on $SrTiO_3$ substrates at 450° C. by using the thermoreflectance method. The thermal conductivity of the 100-nm-thick film matches with that of the film grown at 450° C. on a Silicon substrate. The heat capacities for the $Sr_{1-x}La_xTiO_{3-\delta}$ film, the $SrTiO_3$ substrate, and the $LaAlO_3$ film are assumed the same as the published bulk values (Y. S. Toulouian, *Thermophysical Properties of Matter* (Plenum, New York, 1970), vol. 2, 5; W. Schnelle, R. Fischer, E. Gmelin, *J. Phys. D* 34, 846 (2001)), and the thermal conductivity of the $LaAlO_3$ is assumed to equal the bulk value (Schnelle (2001)).

Finally, ZT is plotted as a function of temperature as shown in FIG. 5, line d. At 300 K, ZT is calculated to be ~1.5, which is better than the current state-of-the-art Bismuth telluride alloys. More surprisingly, it ramps up as temperature is decreased, and reaches up to ~17 near ~125 K.

In summary, a large thermoelectric figure-of-merit (ZT) is measured in oxygen-deficient lanthanum-doped single-crystalline strontium titanate ($SrTiO_3$) thin films. ZT is ~1.5 at 300 K and ramps up as temperature decreased, and reaches up to ~17 at ~125 K. The huge enhancement is due to the synergistic effects of doping lanthanum and creating oxygen vacancies—increase the power factor as well as decrease thermal conductivity. A large thermopower is attributed to oxygen vacancies while lanthanum doping and oxygen vacancies decrease electrical resistivity. Furthermore, the impurities are most responsible for a large suppression in thermal conductivity.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

We claim:

1. A thermoelectric system, comprising:
   (A) a substrate comprising a first complex oxide doped with La, Nb or Y, and
   (B) a second complex oxide;
   wherein the second complex oxide is
      (a) embedded within the first complex oxide or
      (b) a first layer indirectly over one surface of the first complex oxide wherein the first layer does not contact the first complex oxide;
   wherein: the second complex oxide is of the formula $M^1_{a-x}M^2_bM^3_xO_{c-\delta}$(I) or $M^1_aM^2_{b-x}M^3_xO_{c-\delta}$(II) or $M^1_aM^2_bO_{c-\delta}$(III); $M^1$ is one element selected from the group consisting of Na, K, Li, Ti, V, Cr, Mn, Fe, Ni, Cu, Zn, Pb, Ca, Sr, Ba, Al, Y, and Bi; $M^2$ is one element selected from the group consisting of Ti, V, Cr, Mn, Fe, Co, Ni, Cu, Mo, W, Nb, Ta, and Ag; $M^3$ is one element selected from the group consisting of La, Nb, and Y; $M^1$, $M^2$ or $M^3$ are different elements from each other; and $1 \leq a \leq 4$; $1 \leq b \leq 4$; $2 \leq c \leq 10$; $0 \leq x \leq 4$; and $0 < \delta \leq c$ for formula (I) and (II) and $0 \leq \delta \leq c$ for formula (III).

2. The system of claim 1, wherein the first complex oxide is of the formula $M^1_{a-x}M^2_bM^3_xO_{c-\delta}$ or $M^1_aM^2_{b-x}M^3_{b-x}O_{c-\delta}$; wherein $M^1$ is one element selected from the group consisting of Na, K, Li, Ti, V, Cr, Mn, Fe, Ni, Cu, Zn, Pb, Ca, Sr, Ba, Al, Y, and Bi; wherein $M^2$ is one element selected from the group consisting of Ti, V, Cr, Mn, Fe, Co, Ni, Cu, Mo, W, Nb, Ta, and Ag; $M^3$ is one element selected from the group consisting of La, Nb, and Y; $M^1$, $M^2$ or $M^3$ are different elements; and $1 \leq a \leq 4$; $1 \leq b \leq 4$; $2 \leq c \leq 10$; $0 < x \leq 4$; and $0 < \delta \leq c$.

3. The system of claim 1, wherein the second complex oxide is of a nanostructure embedded within the first complex oxide.

4. The system of claim 1, wherein the first complex oxide has a $ZT \geq 1.5$ at 300 K and/or $ZT \geq 15$ at 125 K.

5. The system of claim 2, wherein the first complex oxide is one selected from the group consisting of $BaTiO_3$, $SrTiO_3$, $PbTiO_3$, $NaCo_2O_4$, and $BiFeO_3$ having an oxygen vacancy and doped with La, Nb or Y.

6. The system of claim 1, wherein the first complex oxide is $SrTiO_3$ and $0 < x \leq 1$ for the second complex oxide.

7. The system of claim 1, wherein the first complex oxide is $NaCo_2O_4$ and $0 < x \leq 2$ for the second complex oxide.

8. The system of claim 1, further comprising a $LaAlO_3$ (LAO) layer between the first complex oxide and the first layer, wherein the second complex oxide is the first layer indirectly over one surface of the first complex oxide.

9. The system of claim 8, wherein the LAO layer has a thickness less than about 20 nm.

10. A device comprising the system of claim 1, wherein the system contacts a first electrode and a second electrode.

11. A thermoelectric power generator comprising the device of claim 10.

12. The system of claim 5, further comprising a LaAlO$_3$ (LAO) layer between the first complex oxide and the first layer, wherein the second complex oxide is the first layer indirectly over one surface of the first complex oxide.

13. The system of claim 12, wherein the LAO layer has a thickness less than about 20 nm.

14. A thermoelectric system, comprising:
(A) a substrate comprising a first complex oxide doped with La, Nb or Y, and
(B) a second complex oxide;
wherein the second complex oxide is
(a) embedded within the first complex oxide,
(b) a first layer directly over one surface of the first complex oxide, or
(c) a first layer indirectly over one surface of the first complex oxide wherein the first layer does not contact the first complex oxide;
wherein: the second complex oxide is of the formula $M^1_{a-x}M^2_bM^3_xO_{c-\delta}$ (I) or $M^1_aM^2_{b-x}M^3_xO_{c-\delta}$ (II); $M^1$ is one element selected from the group consisting of Na, K, Li, Ti, V, Cr, Mn, Fe, Ni, Cu, Zn, Pb, Ca, Sr, Ba, Al, Y, and Bi; $M^2$ is one element selected from the group consisting of Ti, V, Cr, Mn, Fe, Co, Ni, Cu, Mo, W, Nb, Ta, and Ag; $M^3$ is one element selected from the group consisting of La, Nb, and Y; $M^1$, $M^2$ or $M^3$ are different elements from each other; and $1 \leq a \leq 4$; $1 \leq b \leq 4$; $2 \leq c \leq 10$; $0 < x \leq 4$; and $0 < \delta \leq c$ for formula (I) and (II).

15. The system of claim 14, wherein the first complex oxide is of the formula $M^1_{a-x}M^2_bM^3_xO_{c-\delta}$ or $M^1_aM^2_{b-x}M^3_xO_{c-\delta}$; wherein $M^1$ is one element selected from the group consisting of Na, K, Li, Ti, V, Cr, Mn, Fe, Ni, Cu, Zn, Pb, Ca, Sr, Ba, Al, Y, and Bi; wherein $M^2$ is one element selected from the group consisting of Ti, V, Cr, Mn, Fe, Co, Ni, Cu, Mo, W, Nb, Ta, and Ag; $M^3$ is one element selected from the group consisting of La, Nb, and Y; $M^1$, $M^2$ or $M^3$ are different elements; and $1 \leq a \leq 4$; $1 \leq b \leq 4$; $2 \leq c \leq 10$; $0 < x \leq 4$; and $0 < \delta \leq c$.

16. The system of claim 14, wherein the second complex oxide is of a nanostructure embedded within the first complex oxide.

17. The system of claim 14, wherein the first complex oxide has a ZT$\geq$1.5 at 300 K and/or ZT$\geq$15 at 125 K.

18. The system of claim 15, wherein the first complex oxide is one selected from the group consisting of BaTiO$_3$, SrTiO$_3$, PbTiO$_3$, NaCo$_2$O$_4$, and BiFeO$_3$ having an oxygen vacancy and doped with La, Nb or Y.

19. The system of claim 18, further comprising a LaAlO$_3$ (LAO) layer between the first complex oxide and the first layer, wherein the second complex oxide is the first layer indirectly over one surface of the first complex oxide.

20. The system of claim 19, wherein the LAO layer has a thickness less than about 20 nm.

21. The system of claim 14, wherein the first complex oxide is SrTiO$_3$ and $0 < x \leq 1$ for the second complex oxide.

22. The system of claim 14, wherein the first complex oxide is NaCo$_2$O$_4$ and $0 < x \leq 2$ for the second complex oxide.

23. The system of claim 14, further comprising a LaAlO$_3$ (LAO) layer between the first complex oxide and the first layer, wherein the second complex oxide is the first layer indirectly over one surface of the first complex oxide.

24. The system of claim 23, wherein the LAO layer has a thickness less than about 20 nm.

25. A device comprising the system of claim 14, wherein the system contacts a first electrode and a second electrode.

26. A thermoelectric power generator comprising the device of claim 25.

* * * * *